United States Patent [19]

Tison

[11] 4,341,607
[45] Jul. 27, 1982

[54] SOLAR POWER SYSTEM REQUIRING NO ACTIVE CONTROL DEVICE

[75] Inventor: Raymond R. Tison, St. Johns, Mich.

[73] Assignee: E:F Technology, Inc., St. Johns, Mich.

[21] Appl. No.: 214,193

[22] Filed: Dec. 8, 1980

[51] Int. Cl.³ .................. C25B 1/02; H01L 31/04
[52] U.S. Cl. ........................... 204/129; 136/291; 136/293; 204/228; 323/304; 323/364; 323/906
[58] Field of Search ............... 204/129, 228; 136/291, 136/293; 323/304, 364, 906

[56] References Cited
U.S. PATENT DOCUMENTS

| | | | |
|---|---|---|---|
| 3,384,806 | 5/1968 | Hartman | 322/2 |
| 3,696,286 | 10/1972 | Ule | 323/15 |
| 4,009,051 | 2/1977 | Kazis et al. | 320/15 |
| 4,080,221 | 3/1978 | Manelas | 136/248 |
| 4,160,816 | 7/1979 | Williams et al. | 423/648 R |

FOREIGN PATENT DOCUMENTS 2810913 9/1979 Fed. Rep. of Germany ...... 136/291

OTHER PUBLICATIONS

D. M. Divan et al., "Maximisation of Operating Efficiency of Solar Cells", *Energy Conversion*, vol. 17, pp. 183–188 (1977).

R. L. Pickerell et al., "An Inverter/Controller Subsystem Optimized for Photovoltaic Applications," *Conf. Record, 13th IEEE Photovoltaic Specialists Conf.* (1978), pp. 984–991.

*Primary Examiner*—Aaron Weisstuch
*Attorney, Agent, or Firm*—Thomas W. Speckman

[57] ABSTRACT

A solar power system has a photovoltaic array having a locus of peak power points for various insolation levels, a voltage-dependent variable resistance load such as a water electrolysis unit electrically connected to the array, and a demand-dependent variable resistance load such as a DC to AC inverter connected in parallel with the electrolysis unit. The electrolysis unit or other voltage-dependent variable resistance load has a voltage-current characteristic in which the operating point is displaced from the array's peak power point for most insolation levels. The characteristic is displaced towards higher voltage-lower current operating points. The inverter may move the operating point of the photovoltaic array toward its peak power point when the load requires power. The system may be designed so that the array operates within about 5 percent of its peak power point over a wide range of inverter power demands. A fuel cell may be connected in parallel with the array to provide power to the inverter at low insolation levels, at night or in low sunlight. The fuel cell may use the hydrogen produced by the electrolysis unit for fuel. The total photovoltaic power made available by the system of this invention is generally greater than 95 percent and often greater than 98 percent of the maximum power which the photovoltaic array may produce for many insolation levels.

30 Claims, 3 Drawing Figures

SOLAR POWER SYSTEM REQUIRING NO ACTIVE CONTROL DEVICE

BACKGROUND OF THE INVENTION

This invention relates to solar power systems, and more particularly to solar power systems which provide useful power for immediate consumption and also provide energy which may be stored for later use. The characteristics of the components of the systems enable a photovoltaic array to operate near its peak power point over a wide range of solar insolation levels without an active power control device.

Photovoltaic arrays convert the electromagnetic energy of the sun into electrical energy. The electricity may be consumed immediately, or it may be converted into another form of energy and stored for later use. Often, the electricity is used to charge batteries or power electrical loads, including water electrolysis units. A water electrolysis unit uses electricity to convert water into hydrogen and oxygen gas. The hydrogen may be stored and used at a later time to fuel a number of other energy generating devices, including fuel cells.

The use of solar arrays to power electrolysis equipment is described in U.S. Pat. No. 4,160,816. U.S. Pat. No. 4,021,323 teaches use of the current produced by exposure of photovoltaic cells to light to produce an electrochemical reaction in an electrolyte in contact with the photovoltaic sources. Exemplary is the production of hydrogen from an aqueous solution of hydrogen iodide. However, electrical energy is not produced for immediate consumption outside of the electrolysis unit.

A photovoltaic array is essentially a constant current source at a given insolation level, particularly when operated at voltages less than that which produces the maximum power output of the array. The constant current is essentially a function of the insolation level.

The voltage output of a photovoltaic array may range from zero under short circuit conditions to its peak (an array design parameter) under a no load condition. The insolation level will have some effect on the voltage at which a photovoltaic array develops its peak power. The insolation level has a minor effect on the no load voltage, but the short circuit current is directly proportional to the isolation level.

The power output potential of a photovoltaic array is a function of the intensity of the solar radiation or insolation level. The actual power output is a function of the voltage developed across the load and the current drawn by the load.

Photovoltaic arrays may be operated over a range of voltage-current levels or power points. For any particular insolation level, however, there is a power point at which a photovoltaic array operates at its maximum or peak power. A locus of such peak power points may be identified for various insolation levels.

The array load may consist of one or more devices and may have a resistance which is either fixed, varies as a function of the demand or varies as a function of the voltage applied. A resistive heating element is an example of a fixed resistance device which may convert electrical energy into heat for applications such as water heating, cooking or any other process which requires heat. A D.C. to A.C. inverter is an example of a load which can vary its input resistance (generally termed impedance) as a function of demand. An inverter converts direct current electrical energy into alternating current electrical energy to provide power to A.C. device(s). The A.C. device(s) may be turned on and off randomly according to the demands of the user. A water electrolysis unit is an example of a load which varies its impedance as a function of the voltage applied.

An electrolysis unit may be designed which has a voltage-current characteristic similar to the locus of peak power points of a photovoltaic array, as suggested in a Final Report to the California Institute of Technology Jet Propulsion Laboratory pursuant to Contract No. 955492, June, 1980, by R. W. Foster, R. R. Tison, W. J. D. Escher and J. A. Hanson. Perfect assimilation over a wide range of power levels is difficult to attain, however, and the voltage-current characteristic, or impedance (resistance), of the electrolysis unit changes as it is used. The resistance of the electrolysis unit decreases as cell temperatures increase. An increase in the amount of hydrogen dissolved in the cathode increases the unit's resistance. Other factors, such as electrode activity and carbonate formation, also affect the voltage-current characteristic of the unit. In addition, the photovoltaic array's peak power points will shift somewhat as a function of the array's operating temperature. Thus, the electrolysis unit may not always operate near the peak power points of the photovoltaic array.

The use of an active power control device has been suggested as a means of maintaining the array at its peak power points in a paper presented at the Annual Meeting of the International Solar Energy Society, Los Angeles, Calif., 1975, by E. N. Costogue and R. K. Yasui, in another paper presented at the 11th Intersociety Energy Conference, State Line, Nev., 1976, by K. E. Cox, and in yet another paper presented at the 3rd World Hydrogen Energy Conference, Tokyo, Japan, June, 1980, by D. Esteve, C. Ganibal, D. Steinmetz and A. Vialaron. The control device suggested in these papers is essentially a DC-DC converter connected in series between the photovoltaic array and the electrolysis unit. A power sensing circuit varies the input impedance of the converter so that the photovoltaic array operates at its peak power point at all times. These papers suggest that the power output of solar systems may be maximized by such an active power control device.

Cascading electrolysis cells to synthesize a desired impedance by using an active switching device which switches electrolysis cells in and out of the system is a means of maximizing the power output of the array. An active array switch device that switches portions of the photovoltaic array in and out of the system may also be used. However, none of the prior art known to the inventor suggests means of operating the photovoltaic array near its peak operating point and compensating for changes in the impedance of the electrolysis unit and the power available from the photovoltaic array without the use of an active power control device or an active switching device of some sort.

An active power control device compensates for changes in impedance by matching the impedance of the electrolysis unit to that of the photovoltaic array or vice versa or both. However, while the active power control device may maintain the operating efficiency of the photovoltaic array at a fairly high level, i.e., 95 percent or greater, the control device itself requires 5 or 10 percent of the power produced by the photovoltaic array. Thus, the maximum power which may be transferred and used is about 90 to 95 percent of the maximum power available from the photovoltaic array. Thus, there is a need for a solar power system which provides more than 90 to 95 percent of the maximum power available from the photovoltaic array for immediate consumption and energy storage, for a more efficient system.

The active power control device also increase the cost and complexity of the system. The increased complexity may result in decreased reliability. Thus, there is a need for a solar power control system which eliminates an active power control device to reduce costs and the complexity of the system. Reducing complexity increases reliability.

OBJECTS OF THE INVENTION

Accordingly, an object of the present invention is to provide a solar power system having increased overall energy efficiency.

Another object is to provide a solar power system which has reduced complexity and thus increased reliability.

Still another object is to provide solar power systems which generally transfer over 90 to 95 percent of the maximum power available from the photovoltaic array to useful loads in the system, and often transfer over 98 percent of the maximum available power.

Yet another object is to provide a solar power system which transfers electrical energy from a solar array to a water electrolysis unit for energy storage and to a DC to AC inverter for immediate consumption while maintaining the photovoltaic array power within a few percent of its peak power point, without an active power control device.

SUMMARY OF THE INVENTION

In keeping with one aspect of this invention, a solar power system has a photovoltaic array having a locus of peak power points for various insolation levels, a voltage dependent variable resistance load such as a water electrolysis unit electrically connected to the photovoltaic array, and a demand dependent variable resistance load such as a DC to AC inverter connected in parallel with the electrolysis unit. The electrolysis unit, or other voltage controlled variable resistance load, has a voltage-current characteristic in which the operating point is displaced from the photovoltaic array's peak power point for most insolation levels. It is displaced toward higher voltage-lower current operating points. The demand controlled variable resistance load may move the photovoltaic array's operating point toward its peak power point when demand is placed on the load. With appropriate design, the photovoltaic array will operate within a band of power points bounded on each side by the locus of power points representing about 95 percent of the peak power available. A fuel cell may also be used in the system in parallel with the photovoltaic array to power the demand dependent variable resistance load at low insolation levels, at night or in low sunlight. The fuel cell may use, as fuel, the hydrogen produced by the electrolysis unit, which is stored until needed, if desired. The total photovoltaic power made available by the system of this invention is generally greater than 95 percent of the maximum power which the photovoltaic array may produce for most insolation levels, and is often greater than 98 percent of its maximum available power.

BRIEF DESCRIPTION OF THE DRAWINGS

The above mentioned and other features of this invention and the manner of obtaining them will become more apparent, and the invention itself will be best understood by reference to the following description of preferred embodiments of the invention taken in conjunction with the accompanying drawings in which.

DESCRIPTION OF THE PREFERRED EMBODIMENT

Figure 1:
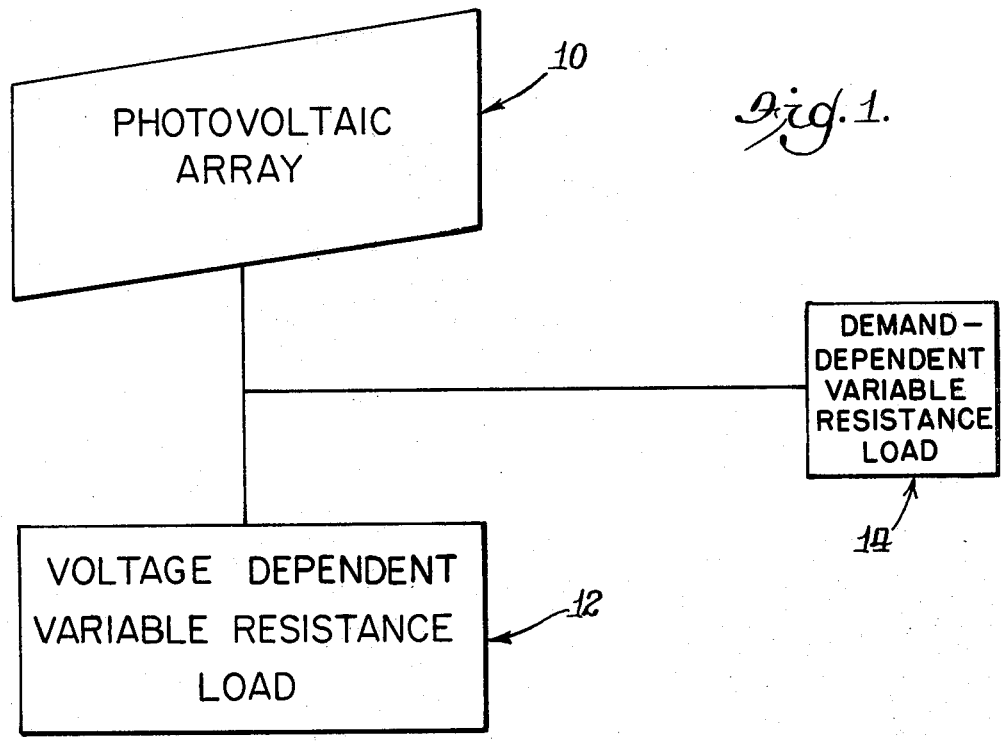
FIG. 1 is a block diagram of a solar power system according to one embodiment of this invention.
Figure 2:
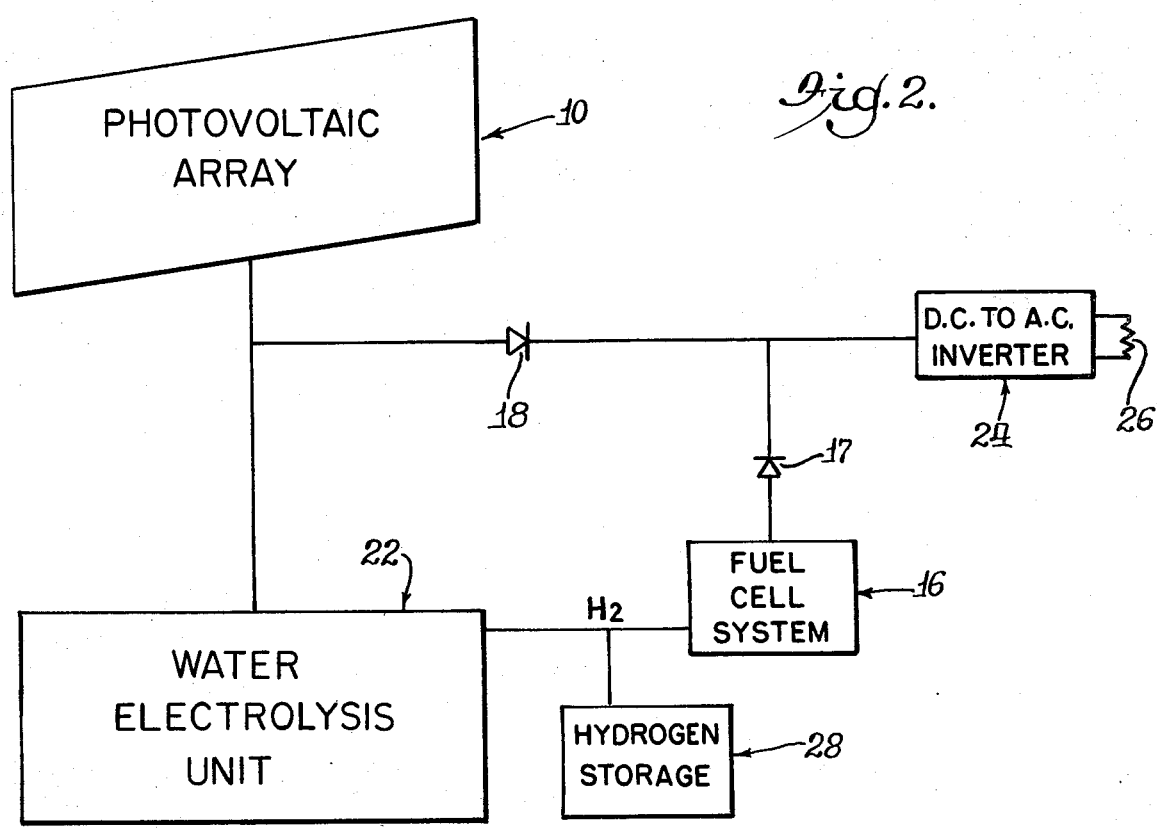
FIG. 2 is a block diagram of a solar power system according to another embodiment of this invention with a fuel cell system and hydrogen storage chamber.

Photovoltaic array 10, as shown in FIG. 1, is electrically connected to a voltage-dependent variable resistance load 12, such as a water electrolysis unit. A demand dependent variable resistance load 14, such as a DC to AC inverter, is connected in parallel with the voltage-dependent variable resistance load 12. As shown in FIG. 2, an additional power source 16, such as a fuel cell with a hydrogen fuel source, may also be connected in parallel with the electrolysis unit 22. The electrolysis unit provides hydrogen which may be stored in storage chamber 28 for later use by fuel cell 16. A blocking diode 18 isolates the electrolysis unit 22 and photovoltaic array 10 from the fuel cell 16 and inverter 24.

Inverter 24 may be any suitable commercial unit. Load 26 of inverter 24 may be a number of AC devices which may be turned on and off more or less randomly, according to the needs of the user. The AC devices may include lights and other devices.

Blocking diode 18 allows current flow from the fuel cell 16 only to the demand dependent variable resistance load, shown as DC to AC inverter 24. At night, or during low sunlight, fuel cell 16 may power inverter 24, but the diode 18 prevents fuel cell 16 from powering electrolysis unit 22 or discharging through the photovoltaic array 10. A second diode 17 prevents current from flowing from the array 10 into the fuel cell system 16. A voltage regulator could be used in place of second diode 17, if desired.

Figure 3:
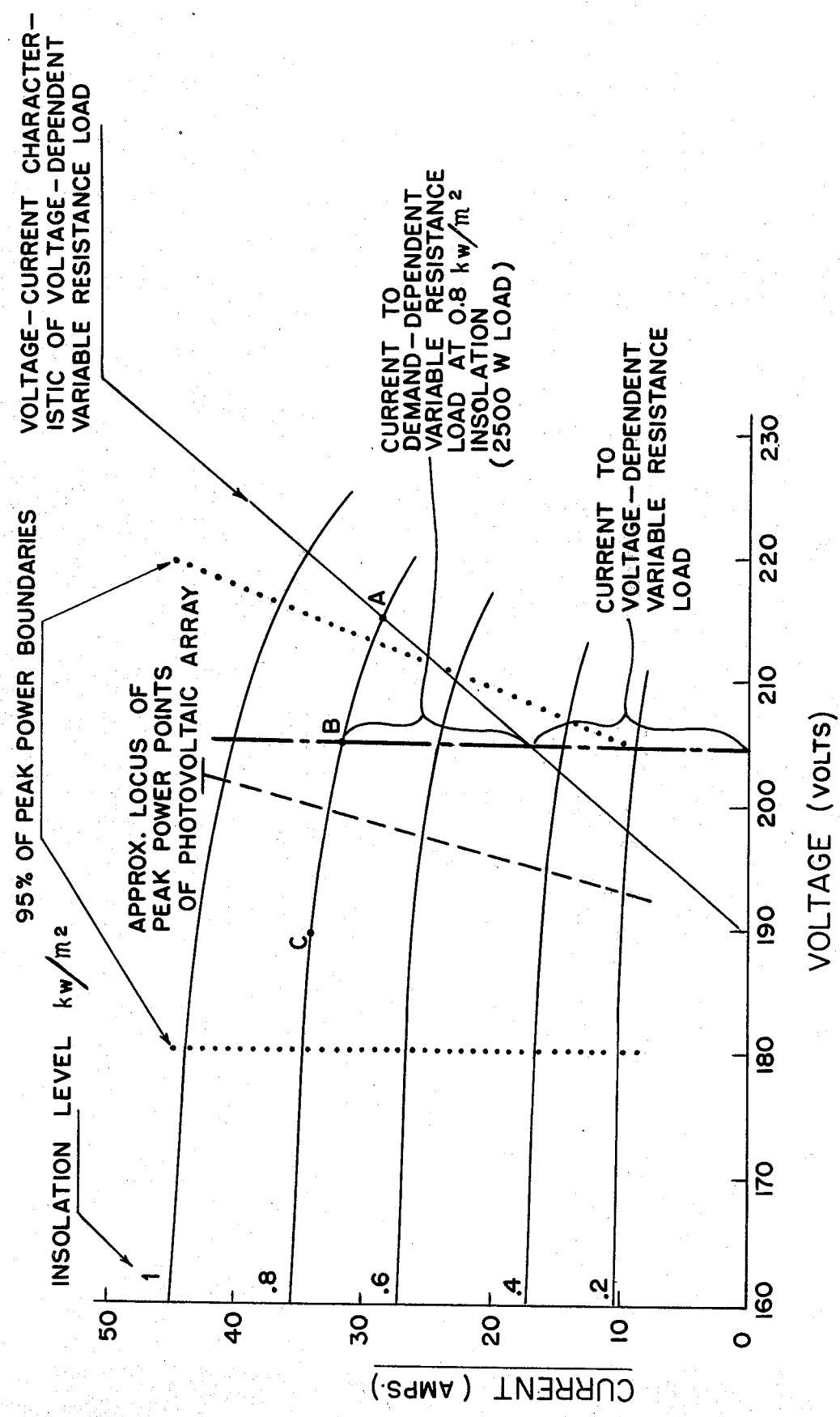
FIG. 3 is a graph showing the voltage-current characteristic of a voltage-dependent variable resistance load, the locus of peak power points of a photovoltaic array at specified insolation levels and the effect of a demand-dependent variable resistance load according to this invention.

Photovoltaic array 10 is a direct current power source having a relatively constant current output over a selected range of voltages for any insolation level, as seen in FIG. 3. The insolation level is a measure of the radiation intensity of the light which activates the photovoltaic array, which may be measured in kilowatts per square meter. Thus, for example, the output of the photovoltaic array at an insolation level of 0.6 kilowatts per square meter may be about 24.4 to 26.6 amperes over the voltage range of about 190 to 207 volts.

A photovoltaic array having the characteristics depicted in FIG. 3 is commercially available from the Solar Power Corporation and other manufacturers and has a maximum power point of about 198 volts and 26 amperes at an insolation level of 0.6 kilowatts per square meter. The most efficient operating points of the photovoltaic array over a range of insolation levels is shown as a dashed line in FIG. 3 and identifies as an "approximate locus of peak power points." A range of power points which are within 5 percent of the locus of peak power points may also be calculated; the boundaries for this range are shown as dotted lines in FIG. 3.

The voltage dependent variable resistance load 12 may have a predetermined voltage-current characteristic, depending on the needs of the system design. However, the voltage-dependent variable resistance load must require less current than that which is available from the photovoltaic array at nearly all its operating points. The remaining available current may then be supplied to the demand-dependent resistance load. The voltage-dependent variable resistance load 12 may be a water electrolysis unit 22, as shown in FIG. 2, for the direct separation of hydrogen and oxygen from water. Such electrolysis units are available from Teledyne Energy Systems and other manufacturers. At an isolation level of 0.8 kw/m², the output of the photovoltaic array with no load from the demand-controlled variable resistance load and the electrolysis unit having the design parameters shown in FIG. 3 is approximately 28 amperes at 215 volts (Point A). The power consumed is slightly less than 95 percent of the peak power which the photovoltaic array could produce at that insolation level.

The parallel resistance of the demand-dependent variable resistance load and the voltage-dependent variable resistance load is less than the resistance of the voltage-dependent variable resistance load. Thus, the system operating point will be changed toward the peak power point as the resistance of the demand-dependent variable resistance load decreases with increasing load and the resistance of the voltage-dependent variable resistance load increases with decreasing voltage, as seen in FIG. 3. For example, at an insolation level of 0.8 kw/m², the photovoltaic array will operate at about 215 volts and 28 amps for a photovoltaic array power output of about 6.02 kw when only the voltage-dependent variable resistance load is drawing current, as shown by Point A in FIG. 3. As the demand-dependent variable resistance load draws current, the operating voltage of the photovoltaic array is reduced and the current is increased. In the system shown in FIG. 3, a 2500 W load from the demand-dependent variable resistance load shifts the system from operating Point A to Point B. At this point, the demand-dependent variable resistance load draws about 15 amps and the voltage-dependent variable resistance load draws about 20 amps, providing utilization of 32 amps at 205 volts for a photovoltaic array power output of about 6.56 kw. At Point B, the photovoltaic array is providing higher than about 98 percent of its peak power available. When the demand-dependent variable resistance load draws about 33 amps, as at Point C in FIG. 3, the voltage-dependent variable resistance load draws almost no current. However, the total power utilized by the system is still greater than about 95 percent of the maximum power which the photovoltaic array can produce at that insolation level.

This invention provides high useful utilization of the power generated by photovoltaic arrays. The elimination of the active power control devices of the prior art reduces the cost of the system as well as its complexity, which increases the reliability of the system of this invention. The system of this invention transfers over about 95 percent of the maximum power which may be generated in the photovoltaic array for immediate consumption, or for energy storage without an active power control device, and often transfers over 98 percent of the maximum available array power.

TABLE 1

SOLAR POWERED WATER ELECTROLYSIS-INVERTER SYSTEM
(insolation level 1 kw/sq · m)

| POWER TO INVERTER, W | APPROXIMATE SYSTEM VOLTAGE | POWER TO ELECTROLYZER, W | PV ARRAY OUTPUT, W | PV OUTPUT AS % OF PEAK POWER AVAIL. |
|---|---|---|---|---|
| 500 | 216.1 | 7373 | 7873 | 94.5 |
| 1000 | 214.8 | 6952 | 7952 | 95.4 |
| 1500 | 213.4 | 6523 | 8023 | 96.2 |
| 2000 | 212.0 | 6087 | 8087 | 97.0 |
| 2500 | 210.5 | 5644 | 8144 | 97.7 |
| 3000 | 209.0 | 5194 | 8194 | 98.3 |
| 3500 | 207.5 | 4736 | 8236 | 98.8 |
| 4000 | 205.9 | 4270 | 8270 | 99.2 |
| 4500 | 204.2 | 3796 | 8296 | 99.5 |
| 5000 | 202.5 | 3313 | 8313 | 99.7 |
| 5500 | 200.8 | 2822 | 8322 | 99.9 |
| 6000 | 198.9 | 2323 | 8323 | 99.9 |
| 6500 | 197.0 | 1814 | 8314 | 99.8 |
| 7000 | 195.1 | 1296 | 8296 | 99.5 |
| 7500 | 193.0 | 769 | 8269 | 99.2 |
| 8000 | 190.9 | 232 | 8232 | 98.8 |

TABLE 2

SOLAR POWERED WATER ELECTROLYSIS-INVERTER SYSTEM
(insolation level .8 kw/sq · m)

| POWER TO INVERTER, W | APPROXIMATE SYSTEM VOLTAGE | POWER TO ELECTROLYZER, W | PV ARRAY OUTPUT, W | PV OUTPUT AS % OF PEAK POWER AVAIL. |
|---|---|---|---|---|
| 500 | 211.4 | 5904 | 6404 | 96.6 |
| 1000 | 209.9 | 5459 | 6459 | 97.4 |
| 1500 | 208.4 | 5007 | 6507 | 98.1 |
| 2000 | 206.8 | 4548 | 6548 | 98.7 |
| 2500 | 205.2 | 4081 | 6581 | 99.2 |
| 3000 | 203.6 | 3605 | 6605 | 99.6 |

TABLE 2-continued
SOLAR POWERED WATER ELECTROLYSIS-INVERTER SYSTEM
(insolation level .8 kw/sq · m)

| POWER TO INVERTER, W | APPROXIMATE SYSTEM VOLTAGE | POWER TO ELECTROLYZER, W | PV ARRAY OUTPUT, W | PV OUTPUT AS % OF PEAK POWER AVAIL. |
|---|---|---|---|---|
| 3500 | 201.8 | 3122 | 6622 | 99.9 |
| 4000 | 200.1 | 2630 | 6630 | 100.0 |
| 4500 | 198.2 | 2130 | 6630 | 100.0 |
| 5000 | 196.3 | 1622 | 6622 | 99.9 |
| 5500 | 194.3 | 1105 | 6605 | 99.6 |
| 6000 | 192.3 | 579 | 6579 | 99.2 |
| 6500 | 190.2 | 46 | 6546 | 98.7 |

TABLE 3
SOLAR POWERED WATER ELECTROLYSIS-INVERTER SYSTEM
(insolation level .6 kw/sq · m)

| POWER TO INVERTER, W | APPROXIMATE SYSTEM VOLTAGE | POWER TO ELECTROLYZER, W | PV ARRAY OUTPUT, W | PV OUTPUT AS % OF PEAK POWER AVAIL. |
|---|---|---|---|---|
| 500 | 206.9 | 4555 | 5055 | 98.1 |
| 1000 | 205.3 | 4093 | 5093 | 98.8 |
| 1500 | 203.6 | 3622 | 5122 | 99.4 |
| 2000 | 201.9 | 3142 | 5142 | 99.8 |
| 2500 | 200.2 | 2652 | 5152 | 100.0 |
| 3000 | 198.3 | 2153 | 5153 | 100.0 |
| 3500 | 196.4 | 1645 | 5145 | 99.8 |
| 4000 | 194.4 | 1127 | 5127 | 99.5 |
| 4500 | 192.4 | 601 | 5101 | 99.0 |
| 5000 | 190.3 | 66 | 5066 | 98.3 |

TABLE 4
SOLAR POWERED WATER ELECTROLYSIS-INVERTER SYSTEM
(insolation level .4 kw/sq · m)

| POWER TO INVERTER, W | APPROXIMATE SYSTEM VOLTAGE | POWER TO ELECTROLYZER, W | PV ARRAY OUTPUT, W | PV OUTPUT AS % OF PEAK POWER AVAIL. |
|---|---|---|---|---|
| 500 | 200.1 | 2628 | 3128 | 99.5 |
| 1000 | 198.3 | 2139 | 3139 | 99.9 |
| 1500 | 196.4 | 1643 | 3143 | 100.0 |
| 2000 | 194.5 | 1140 | 3140 | 99.9 |
| 2500 | 192.5 | 630 | 3130 | 99.6 |
| 3000 | 190.5 | 114 | 3114 | 99.1 |

TABLE 5
SOLAR POWERED WATER ELECTROLYSIS-INVERTER SYSTEM
(insolation level .2 kw/sq · m)

| POWER TO INVERTER, W | APPROXIMATE SYSTEM VOLTAGE | POWER TO ELECTROLYZER, W | PV ARRAY OUTPUT, W | PV OUTPUT AS % OF PEAK POWER AVAIL. |
|---|---|---|---|---|
| 500 | 195.6 | 1430 | 1930 | 99.5 |
| 1000 | 193.7 | 937 | 1937 | 99.9 |
| 1500 | 191.8 | 439 | 1939 | 100.0 |

The output of a photovoltaic array having a peak photovoltaic power available of 8334.1 W is shown for various inverter power levels at a solar insolation level of 1 kw/m², as shown in Table 1. The output of the photovoltaic array is within about 5.5 percent of its peak power point when the inverter utilizes between about 500 watts and 8,000 watts of power from the photovoltaic array, and is within about 2 percent of its peak power point when the inverter utilizes between about 3,000 and 8,000 watts of array power—the remaining power going to the electrolyzer. At a solar insolation level of 0.8 kw/m², the photovoltaic array has a peak power available of 6,631.6 W. The array operates within about 3.4 percent of its peak power point when between 500 and 6,500 watts of power is utilized by the inverter and within about 2 percent of the peak power point when the inverter utilizes between about 1,500 and 6,500 watts of array power, as seen in Table 2. At a solar insolation level of 0.6 kw/m², the photovoltaic array has a peak power available of 5,154.2 W and operates within about 2 percent of its peak power point when the inverter utilizes between 500 and 5,000 watts of power (Table 3); and at a solar insolation level of 0.4 kw/m², the photovoltaic array has a peak power available of 3,143.6 W and operates at over about 99.5 percent of its available peak power when the inverter utilizes between 500 and 3,000 watts of power, as seen in Table 4. At a solar insolation level of 0.2 kw/m² (Table 5), the photovoltaic array has a peak power available of 1,939 W and delivers over about 99.5 percent of its available peak power when the inverter utilizes between 500 watts and 1,500 watts of power. The array operates within about 5 percent of its peak power point when the inverter draws at least about 6 percent of the maximum power available at 1 kw/m$^2$.

may produce at an insolation level of 1 kw/m$^2$ when the power consumed by the inverter is between 1,237 and 8,023 watts, and is within 2 percent when the inverter consumes between 3,519 and 8,023 watts.

TABLE 2

SOLAR POWERED WATER ELECTROLYSIS-INVERTER SYSTEM
(insolation level 1 kw/sq · m)

| POWER TO INVERTER, W | APPROXIMATE SYSTEM VOLTAGE | POWER TO ELECTROLYZER, W | PV ARRAY OUTPUT, W | PV OUTPUT AS % OF PEAK POWER AVAIL. |
|---|---|---|---|---|
| 1237 | 216.4 | 6636 | 7873 | 94.5 |
| 1695 | 214.8 | 6257 | 7952 | 95.4 |
| 2152 | 213.4 | 5871 | 8023 | 96.2 |
| 2609 | 212.0 | 5478 | 8087 | 97.0 |
| 3064 | 210.5 | 5080 | 8144 | 97.7 |
| 3519 | 209.0 | 4675 | 8194 | 98.3 |
| 3974 | 207.5 | 4262 | 8236 | 98.8 |
| 4427 | 205.9 | 3843 | 8270 | 99.2 |
| 4880 | 204.2 | 3416 | 8296 | 99.5 |
| 5331 | 202.5 | 2982 | 8313 | 99.7 |
| 5782 | 200.8 | 2540 | 8322 | 99.9 |
| 6233 | 198.9 | 2070 | 8343 | 99.9 |
| 6681 | 197.0 | 1633 | 8314 | 99.8 |
| 7130 | 195.1 | 1166 | 8296 | 99.5 |
| 7577 | 193.0 | 692 | 8269 | 99.2 |
| 8023 | 190.9 | 208 | 8232 | 98.8 |

TABLE 7

SOLAR POWERED WATER ELECTROLYSIS-INVERTER SYSTEM
(insolation level 1 kw/sq · m)

| POWER TO INVERTER, W | APPROXIMATE SYSTEM VOLTAGE | POWER TO ELECTROLYZER, W | PV ARRAY OUTPUT, W | PV OUTPUT AS % OF PEAK POWER AVAIL. |
|---|---|---|---|---|
| 305 | 214.8 | 7647 | 7952 | 95.4 |
| 848 | 213.4 | 7175 | 8027 | 96.2 |
| 1391 | 212.0 | 6696 | 8087 | 97.0 |
| 1936 | 210.5 | 6208 | 8144 | 97.7 |
| 2481 | 209.0 | 5713 | 8194 | 98.3 |
| 3026 | 207.5 | 5210 | 8236 | 98.8 |
| 3573 | 205.9 | 4697 | 8270 | 99.2 |
| 4120 | 204.2 | 4176 | 8296 | 99.5 |
| 4669 | 202.5 | 3644 | 8313 | 99.7 |
| 5218 | 200.8 | 3104 | 8322 | 99.9 |
| 5768 | 198.9 | 2555 | 8323 | 99.9 |
| 6319 | 197.0 | 1995 | 8314 | 99.8 |
| 6870 | 195.1 | 1426 | 8296 | 99.5 |
| 7424 | 193.0 | 845 | 8269 | 99.2 |
| 7977 | 190.9 | 255 | 8232 | 98.8 |

The voltage-current characteristic of a voltage-dependent variable resistance load, such as a water electrolysis unit, may be affected by factors such as electrode activity and carbonate formation, the amount of hydrogen dissolved in the cathode, and the temperature of the electrolysis unit. During startup, for example, the temperature of the electrolysis unit is less than the design operating temperature, and the voltage-current curve is displaced toward higher voltages, moving toward lower voltages as the unit warms up. Such variations in the voltage-current characteristic of the electrolysis unit may be compensated for by the demand-dependent variable resistance load, which draws a portion of the photovoltaic array output current. The current which the demand-dependent variable resistance load, such as inverter 14, draws is a function of the resistance of the load 26 which is connected to the output of the inverter, which may be one or more devices such as heating coils, lights and other power consuming devices.

If the impedance of the electrolysis unit increases by 10 percent, as in Table 6, the power consumed by the electrolysis unit and inverter is still within about 5.5 percent of the peak power which the photovoltaic array If the impedance of the electrolysis unit decreases by 10 percent, as in Table 7, the power consumed by the electrolysis unit and inverter is also greater than about 95 percent of the peak power which the photovoltaic array may produce at an insolation level of 1 kw/m$^2$ when the power consumed by the inverter is between 305 and 7,977 watts, and is within 2 percent when the inverter consumes between 2,481 and 7,977 watts. Shifts in the electrolyzer impedance only impact the system by changing the load range the inverter can operate over and still maintain the photovoltaic output near its peak power point.

The photovoltaic array may have a different voltage-current characteristic than that shown in the drawings, tables and foregoing example, if desired. The voltage-dependent variable resistance load and the demand-dependent variable voltage resistance load may be designed for use with such photovoltaic arrays to produce a system which meets the performance standards of the specific example just described over a broad range of demand-dependent variable resistance load power demands. The range may be defined as a demand which exceeds 6 percent of the maximum power which the array may produce at an insolation level of 1 kw/m$^2$.

While in the foregoing specification, this invention has been described in relation to certain preferred embodiments thereof, and many details have been set forth for purpose of illustration, it will be apparent to those skilled in the art that the invention is susceptible to additional embodiments and that certain of the details described herein can be varied considerably without departing from the basic principles of the invention.

I claim:

1. A solar power system comprising:
    a photovoltaic array having a locus of peak power points for various insolation levels;
    a voltage-dependent variable resistance load electrically connected to said array, said voltage-dependent variable resistance load having a voltage-current characteristic dependent only on voltage under normal operating conditions and such that it consumes less power than the peak power which is available from said photovoltaic array; and
    a demand-dependent variable resistance load electrically connected in parallel with said voltage-dependent load, said demand-dependent variable resistance load changing the load on said photovoltaic array to operate within approximately 5 percent of said locus of peak power points over a range of demand-dependent variable resistance load power demands, making available for immediate consumption and for energy storage about 95 percent or more of the maximum power which said photovoltaic array may produce.

2. The solar power system of claim 1 wherein said array has a maximum power output of about 8,332 watts at an insolation level of 1 kw/m$^2$, 6,632 watts at an insolation level of 0.8 kw/m$^2$, 5,154 watts at an insolation level of 0.6 kw/m$^2$, 3,142 watts at an insolation level of 0.4 kw/m$^2$, and 1,939 1 watts at an insolation level of 0.2 kw/m$^2$; and said array operates within approximately 5 percent of said peak power point when said demand-dependent variable resistance load consumes between about 1,000 and 8,000 watts at an insolation level of 1 kw/m$^2$, between about 500 and 6,500 watts at an insolation level of 0.8 kw/m$^2$, between about 500 and 5,000 watts at an insolation level of 0.6 kw/m$^2$, between about 500 and 3,000 watts at an insolation level of 0.4 kw/m$^2$, and between about 500 and 1,500 watts at an insolation level of 0.2 kw/m$^2$.

3. The solar power system of claim 1 wherein said voltage-dependent variable resistance load comprises a water electrolysis unit which produces hydrogen and oxygen.

4. The solar power system of claim 3 comprising a hydrogen storage chamber for storing the hydrogen produced in said electrolysis unit.

5. The solar power system of claim 1 wherein said demand-dependent variable resistance load comprises a DC to AC electrical inverter having a power consuming load electrically connected to said inverter.

6. The solar power system of claim 1 comprising an additional power source electrically connected in parallel with said photovoltaic array, and means for preventing current from flowing from said power source into said voltage-dependent variable resistance load or said photovoltaic array when the voltage of said power source is greater than or equal to the voltage of said photovoltaic array.

7. The solar power system of claim 6 wherein said current preventing means comprises a diode.

8. The solar power system of claim 6 wherein said additional power source comprises a fuel cell system and second current preventing means for preventing current from flowing from said photovoltaic array into said fuel cell system.

9. The solar power system of claim 8 wherein said second current preventing means comprises a diode.

10. The solar power system of claim 8 wherein said second current preventing means comprises a voltage regulator.

11. A method of increasing the useful power in a solar power system comprising the following steps:
    passing a portion of the current from a photovoltaic array having a locus of peak power points for various insolation levels of solar radiation through a voltage-dependent variable resistance load having a voltage-current characteristic in which the operating conditions of said voltage-dependent variable resistance load result in less power consumption than that which is available from said photovoltaic array at the peak power point of said photovoltaic array; and
    passing the remaining portion of the array current through a demand-dependent variable resistance load, said demand-dependent variable resistance load changing the load on said photovoltaic array to enable said photovoltaic array to operate within approximately 5 percent of said peak power points over a range of demand-dependent variable resistance load power demands,
    whereby about 95 percent and more of the maximum power which said photovoltaic array produces is transferred for useful purposes.

12. The method of claim 11 wherein said demand-dependent variable resistance load comprises a DC to AC electrical inverter having a power consuming load electrically connected to said inverter.

13. The method of claim 11 comprising the steps of enabling additional current to flow from an additional power source to said demand-dependent variable resistance load when the voltage of said additional power source is greater than or equal to the voltage of said photovoltaic array, and preventing current from flowing from said additional power source to said voltage-dependent variable resistance load and said photovoltaic array.

14. The method of claim 13 wherein said additional power source comprises a fuel cell system.

15. The method of claim 14 comprising the step of preventing current from flowing from said photovoltaic array into said fuel cell system.

16. The method of claim 15 wherein a diode prevents current from flowing from said photovoltaic array into said fuel cell system.

17. The method of claim 15 wherein a voltage regulator prevents current from flowing from said photovoltaic array into said fuel cell system.

18. The method of claim 14 wherein said voltage-dependent variable resistance load comprises a water electrolysis unit which produces hydrogen and oxygen.

19. The method of claim 18 comprising the step of supplying hydrogen produced in said electrolysis unit directly to a hydrogen storage chamber for use in said fuel cell system.

20. A solar power system comprising:
    a photovoltaic array;

a water electrolysis unit which provides a voltage-dependent variable resistance load and produces hydrogen and oxygen electrically connected to said photovoltaic array;

a demand-dependent variable resistance load electrically connected in parallel with said electrolysis unit;

and a hydrogen storage chamber for storing hydrogen produced in said electrolysis unit.

21. A solar power system comprising:

a photovoltaic array;

a voltage-dependent variable resistance load electrically connected to said photovoltaic array;

a demand-dependent variable resistance load electrically connected in parallel with said voltage-dependent load;

a fuel cell system electrically connected in parallel with said photovoltaic array;

means for preventing current from flowing from said fuel cell system into said voltage-dependent variable resistance load or said photovoltaic array when the voltage of said fuel cell system is greater than or equal to the voltage of said photovoltaic array; and second current preventing means for preventing current from flowing from said photovoltaic array into said fuel cell system.

22. The solar power system of claim 21 wherein said second current preventing means comprises a diode.

23. The solar power system of claim 21 wherein said second current preventing means comprises a voltage regulator.

24. A method of increasing the useful power in a solar power system comprising the following steps:

passing a portion of the current from a photovoltaic array having a locus of peak power points for various insolation levels of solar radiation through a voltage-dependent variable resistance load having a voltage-current characteristic in which the operating conditions of said voltage-dependent variable resistance load result in less power consumption than that which is available from said photovoltaic array at the peak power point of said photovoltaic array;

passing a second portion of the array current through a demand-dependent variable resistance load, said demand-dependent variable resistance load changing the load on said photovoltaic array to enable said photovoltaic array to operate within approximately 5 percent of said peak power points over a range of demand-dependent variable resistance load power demands;

enabling additional current to flow from a fuel cell system to said demand-dependent variable resistance load when the voltage of said fuel cell system is greater than or equal to the voltage of said photovoltaic array; and preventing current from flowing from said fuel cell system to said voltage-dependent variable resistance load and said photovoltaic array;

whereby about 95 percent and more of the maximum power which said photovoltaic array produces is transferred for useful purposes.

25. The method of claim 24 comprising the step of preventing current from flowing from said photovoltaic array into said fuel cell system.

26. The method of claim 25 wherein a diode prevents current from flowing from said photovoltaic array into said fuel cell system.

27. The method of claim 25 wherein a voltage regulator prevents current from flowing from said photovoltaic array into said fuel cell system.

28. The method of claim 24 wherein said voltage-dependent variable resistance load comprises a water electrolysis unit which produces hydrogen and oxygen.

29. The method of claim 28 comprising the step of supplying hydrogen produced in said electrolysis unit directly to a hydrogen storage chamber for use in said fuel cell system.

30. A method of increasing the useful power in a solar power system comprising the following steps:

passing a portion of the current from the photovoltaic array through a water electrolysis unit which provides a voltage-dependent variable resistance load and produces hydrogen and oxygen;

passing the remaining portion of the array current through a demand-dependent variable resistance load; and storing hydrogen produced in said electrolysis unit in a hydrogen storage chamber.

* * * * *